United States Patent
Tadano

(10) Patent No.: US 8,774,258 B2
(45) Date of Patent: Jul. 8, 2014

(54) PAPR (PEAK-TO-AVERAGE POWER RATIO) DETERMINING DEVICE AND COMMUNICATION DEVICE

(75) Inventor: Tsuneaki Tadano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/438,311

(22) Filed: Apr. 3, 2012

(65) Prior Publication Data

US 2012/0250749 A1  Oct. 4, 2012

Related U.S. Application Data

(63) Continuation of application No. PCT/JP2009/067394, filed on Oct. 6, 2009.

(51) Int. Cl.
*H04B 3/46* (2006.01)

(52) U.S. Cl.
USPC ........... 375/224; 375/297; 375/260; 455/126; 455/91; 455/127.2; 330/2; 330/149; 330/291

(58) Field of Classification Search
CPC .............. H04L 27/2614; H04L 27/368; H04L 27/3411; H03F 3/24; H03F 1/3247; H03F 2201/3233; H04B 2001/0425; H04B 2201/70706
USPC ........ 370/200–546; 375/130–377; 455/1–899
See application file for complete search history.

(56) References Cited

U.S. PATENT DOCUMENTS

| | | | |
|---|---|---|---|
| 5,302,914 A * | 4/1994 | Arntz et al. .................... | 330/129 |
| 6,160,449 A | 12/2000 | Klomsdorf et al. | |
| 6,166,598 A | 12/2000 | Schlueter | |
| 6,621,367 B2 | 9/2003 | Suzuki et al. | |
| 6,922,388 B1 * | 7/2005 | Laroia et al. .................. | 370/208 |
| 7,539,269 B2 * | 5/2009 | Vadde et al. .................. | 375/297 |
| 7,949,307 B2 | 5/2011 | Ode | |
| 8,463,207 B2 * | 6/2013 | Pratt et al. ...................... | 455/126 |
| 2004/0131129 A1 * | 7/2004 | Harron et al. ................ | 375/298 |
| 2004/0160893 A1 * | 8/2004 | Park et al. ..................... | 370/206 |
| 2005/0093625 A1 * | 5/2005 | Khlat et al. ................... | 330/129 |
| 2006/0046764 A1 * | 3/2006 | Ohba et al. ................... | 455/522 |
| 2006/0067426 A1 * | 3/2006 | Maltsev et al. ............... | 375/297 |
| 2006/0078066 A1 * | 4/2006 | Yun et al. ...................... | 375/299 |
| 2006/0111057 A1 * | 5/2006 | Akizuki et al. ............... | 455/108 |

(Continued)

FOREIGN PATENT DOCUMENTS

| | | |
|---|---|---|
| CN | 101009675 A | 8/2007 |
| JP | 2001-68940 | 3/2001 |
| JP | 2001-244828 | 9/2001 |
| JP | 2001-251262 | 9/2001 |
| JP | 2003-37640 | 2/2003 |
| JP | 2003-179657 | 6/2003 |
| JP | 2006-304191 | 11/2006 |
| JP | 2007-49621 | 2/2007 |

OTHER PUBLICATIONS

"Written Amendment" (Machine Translation) for Japanese Application No. 2011-535228.*

(Continued)

*Primary Examiner* — Daniel Washburn
*Assistant Examiner* — Amneet Singh
(74) *Attorney, Agent, or Firm* — Staas & Halsey LLP

(57) ABSTRACT

A PAPR determining device includes a detecting unit and a PAPR determining unit. The detecting unit detects a predetermined value's changes, which is a cause of changes in a saturation power of a power amplifier. When the detecting unit detects any change in the predetermined value, the PAPR determining unit determines a PAPR value that corresponds to the saturation power of the power amplifier.

4 Claims, 12 Drawing Sheets

(56) References Cited

U.S. PATENT DOCUMENTS

| | | | |
|---|---|---|---|
| 2006/0178121 A1* | 8/2006 | Hamalainen et al. | 455/125 |
| 2007/0098109 A1* | 5/2007 | Vadde et al. | 375/297 |
| 2007/0178856 A1* | 8/2007 | Mitzlaff et al. | 455/127.1 |
| 2007/0189417 A1* | 8/2007 | Waheed et al. | 375/300 |
| 2008/0107012 A1 | 5/2008 | Ben Rached et al. | |
| 2008/0130589 A1* | 6/2008 | Gorokhov et al. | 370/336 |
| 2008/0182530 A1* | 7/2008 | Mueller et al. | 455/115.1 |
| 2008/0265996 A1* | 10/2008 | Kim et al. | 330/291 |
| 2008/0266176 A1* | 10/2008 | Nabar et al. | 342/373 |
| 2009/0103639 A1* | 4/2009 | Sankabathula et al. | 375/260 |
| 2009/0256630 A1* | 10/2009 | Brobston | 330/2 |
| 2009/0296585 A1* | 12/2009 | Melis et al. | 370/241 |
| 2009/0310659 A1* | 12/2009 | Garg et al. | 375/222 |
| 2010/0177832 A1* | 7/2010 | Baliga et al. | 375/260 |
| 2010/0177847 A1* | 7/2010 | Woodward | 375/296 |
| 2010/0271997 A1* | 10/2010 | Lai et al. | 370/311 |

OTHER PUBLICATIONS

"Decision to Grant a Patent" (Machine Translation) for Japanese Application No. 2011-535228.*
"Notification of Reasons for Refusal" (Machine Translation) for Japanese Application No. 2011-535228.*
International Search Report of PCT/JP2009/067394 mailed Jan. 12, 2010.
European Search Report mailed Nov. 19, 2013 in application No. 09850225.5.
Chinese Office Action issued on Feb. 26, 2014 in corresponding Chinese Application No. 200980161849.4.

* cited by examiner

PAPR (PEAK-TO-AVERAGE POWER RATIO) DETERMINING DEVICE AND COMMUNICATION DEVICE

CROSS-REFERENCE TO RELATED APPLICATION

This application is a continuation of International Application No. PCT/JP2009/067394, filed on Oct. 6, 2009, the entire contents of which are incorporated herein by reference.

FIELD

The embodiments discussed herein are directed to a PAPR determining device and a communication device.

BACKGROUND

With Worldwide Interoperability for Microwave Access (WiMAX), Long Term Evolution (LTE), which is a standard for the 3.9G mobile communication system, or the like, "orthogonal frequency division multiplexing" is used as a basic transmission system. With the "orthogonal frequency division multiplexing (hereafter, OFDM)", what are called the sub-carriers are transmitted in parallel by using multiple low-speed circuits combined so that it is possible to perform high-speed data transmission that has resistance to intersymbol interference.

Because OFDM has a disadvantage in that the ratio (hereafter, PAPR) between the peak power, which is the value with the maximum amplitude in the signal waveform, and the average power is large, a power amplifier included in a communication device that uses OFDM is requested to have high linearity. FIG. 13 is a graph that illustrates an OFDM signal waveform, which is plotted along the time axis. FIG. 14 is a graph that illustrates the input/output characteristics of a power amplifier. As illustrated in FIG. 13, the PAPR is large in the OFDM signal waveform, which is plotted along the time axis. As illustrated in FIG. 14, the power amplifier has the input/output characteristics such that, if the input power becomes large, the output power is saturated. For example, if a signal with a large amount of power, such as the peak power, is input to the power amplifier, the signal is not correctly output, which results in the distortion of the signal waveform.

For this reason, there is a method of operating a power amplifier within the region that is obtained by subtracting a back-off value from the output power (hereafter, saturation power) during the saturation. A modulation accuracy (hereafter, Error Vector Magnitude (EVM)) is usually decreased if a signal waveform is distorted. Therefore, it is desired to ensure a sufficiently large back-off value; however, a power amplifier with a large saturation power has to be used, which significantly reduces the power added efficiency. As a result, conventional methods of reducing the back-off value to an appropriate value are predominant.

Patent Literature 1: Japanese Laid-open Patent Publication No. 2001-251262
Patent Literature 2: Japanese Laid-open Patent Publication No. 2001-068940

In the above-described conventional technology, however, there is also a problem in that the suppression of the PAPR of an input signal causes a decrease in the EVM. This problem also occurs, not only when the OFDM is used, but also when the Orthogonal Frequency Division Multiple Access (hereafter, OFDMA) is used as a transmission system.

SUMMARY

According to an aspect of an embodiment of the invention, a PAPR determining device includes a detecting unit and a PAPR determining unit. The detecting unit that detects a predetermined value's change that is a cause of change in a saturation power of a power amplifying unit. The determining unit that, when the detecting unit detects any change in the predetermined value, determines a PAPR value that corresponds to the saturation power of the power amplifying unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments will be explained with reference to accompanying drawings.

[a] First Embodiment

First, an explanation is given of a PAPR determining device according to a first embodiment. The PAPR determining device according to the first embodiment detects predetermined value's changes, which are a cause of changes in the saturation power of the power amplifier and, when any change in the predetermined value is detected, dynamically determines a PAPR value of the signal that is to be input to the power amplifier.

Figure 1:
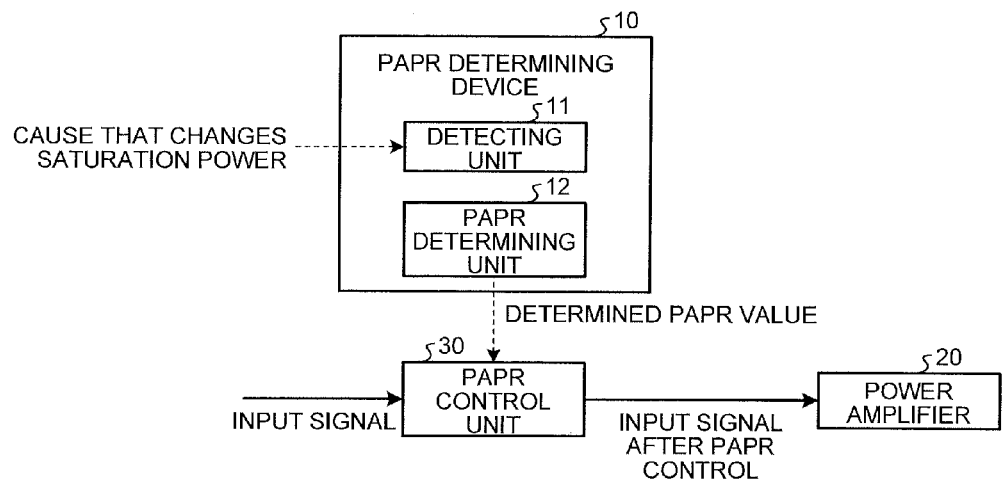
FIG. 1 is a block diagram that illustrates the configuration of a PAPR determining device according to a first embodiment.

FIG. 1 is a block diagram that illustrates the configuration of a PAPR determining device 10 according to the first embodiment. As illustrated in FIG. 1, the PAPR determining device 10 according to the first embodiment includes a detecting unit 11 and a PAPR determining unit 12.

The detecting unit 11 detects predetermined value's changes, which are a cause of changes in the saturation power of a power amplifier 20. When the detecting unit 11 detects any change in the predetermined value, the PAPR determining unit 12 determines a PAPR value that corresponds to the saturation power of the power amplifier 20.

As illustrated in FIG. 1, the PAPR value determined by the PAPR determining unit 12 is used by a PAPR control unit 30 to perform control, and the signal controlled by the PAPR control unit 30 is input to the power amplifier 20. Specifically, the PAPR control unit 30 controls the power of the signal input to the power amplifier 20 so as to obtain the PAPR value determined by the PAPR determining unit 12. The power amplifier 20 amplifies the power of the signal input from the PAPR control unit 30 and outputs the amplified signal.

Figure 2:
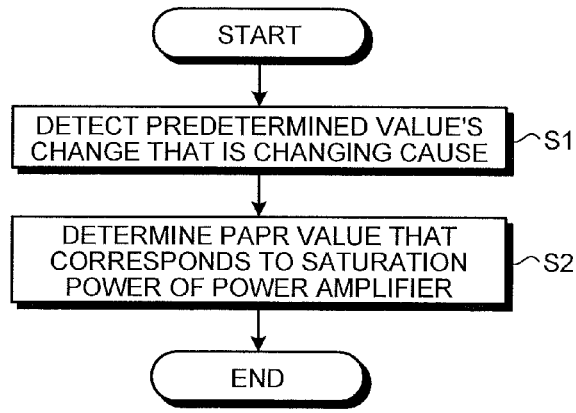
FIG. 2 is a flowchart that illustrates the steps of a process performed by the PAPR determining device according to the first embodiment.

Next, an explanation is given, with reference to FIG. 2, of the steps of a process performed by the PAPR determining device 10 according to the first embodiment. FIG. 2 is a flowchart that illustrates the steps of a process performed by the PAPR determining device 10 according to the first embodiment.

As illustrated in FIG. 2, in the PAPR determining device 10, the detecting unit 11 first detects predetermined value's changes, which are a cause of changes in the saturation power of the power amplifier 20 (Step S1). If the detecting unit 11 in the PAPR determining device 10 detects any change in the predetermined value, the PAPR determining unit 12 determines a PAPR value (Step S2). Specifically, the PAPR determining unit 12 determines a PAPR value such that the power doesn't exceed the saturation power of the power amplifier 20.

As described above, when any change is detected in the predetermined value, which is a cause of changes in the saturation power of the power amplifier 20, the PAPR determining device 10 according to the first embodiment dynamically determines a PAPR value that corresponds to the changed saturation power. Thus, according to the first embodiment, the PAPR control unit 30 controls the power of the signal input to the power amplifier 20 so as to obtain a dynamically determined PAPR value, whereby it is possible to prevent excessive PAPR suppression from being performed by the PAPR control unit 30 and to improve the EVM.

[b] Second Embodiment

Next, an explanation is given of a communication device according to a second embodiment. The communication device according to the second embodiment detects a change in the temperature, which is one of the causes that changes the saturation power of a power amplifier, and, when any change in the temperature is detected, dynamically determines a PAPR value.

Configuration of Communication Device According to Second Embodiment

Figure 3:
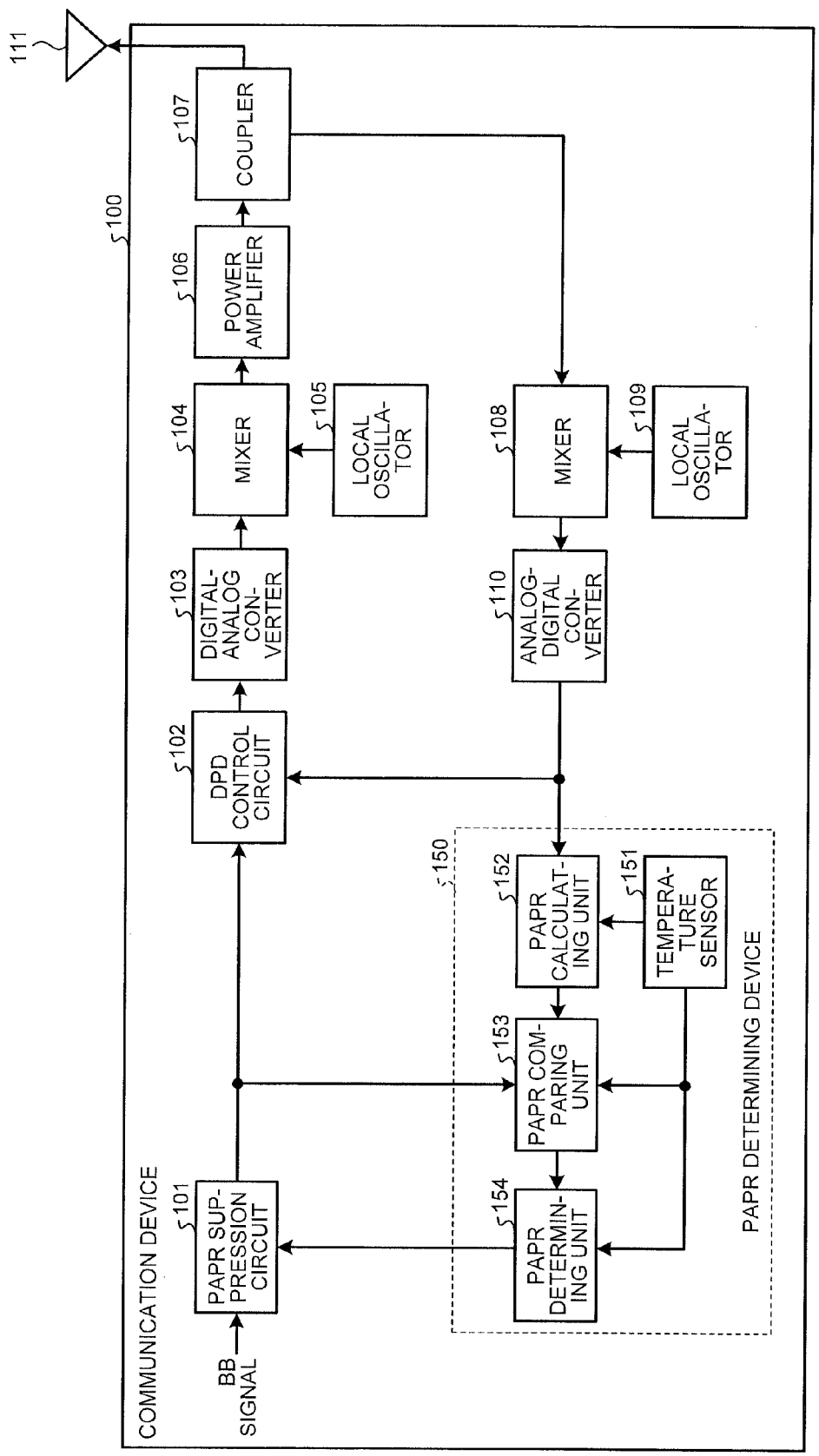
FIG. 3 is a block diagram that illustrates the configuration of a communication device according to a second embodiment.

FIG. 3 is a block diagram that illustrates the configuration of a communication device 100 according to the second embodiment. As illustrated in FIG. 3, the communication device 100 according to the second embodiment has the same functions as those of a common communication device and includes a PAPR suppression circuit 101, a Digital Pre Distortion (DPD) control circuit 102, and a digital-analog converter 103. Furthermore, the communication device 100, which has the same functions as those of a common communication device, includes a mixer 104, a local oscillator 105, a power amplifier 106, and a coupler 107. Moreover, the communication device 100, which has the same functions as those of a common communication device, includes a mixer 108, a local oscillator 109, an analog-digital converter 110, and an antenna 111. The communication device 100 according to the second embodiment further includes a PAPR determining device 150.

When receiving an in-phase component and an quadrature-phase component of a baseband (BB) signal, the PAPR suppression circuit 101 suppresses the baseband signal as needed and outputs the suppressed baseband signal to the DPD control circuit 102. Here, the PAPR value used for the suppression of a baseband signal (hereafter, PAPR suppression) is the optimum value that is dynamically determined by the PAPR determining device 150 and dynamically set by the PAPR determining device 150. Thus, the PAPR suppression circuit 101 performs appropriate PAPR suppression in accordance with the dynamically set PAPR value (hereafter, PAPR set value).

The DPD control circuit 102 compares the digital signal that has been subjected to the PAPR suppression and input from the PAPR suppression circuit 101 with the digital signal that has been fed back from the analog-digital converter 110 so as to extract the difference between the two digital signals. Then, the DPD control circuit 102 performs inverse correction on the digital signal, which has been subjected to the PAPR suppression, in accordance with the extracted difference so as to perform distortion compensation, and outputs the digital signal, which has been subjected to the distortion compensation, to the digital-analog converter 103.

The digital-analog converter 103 converts the digital signal, which has been input from the DPD control circuit 102, into an analog signal and outputs the converted analog signal to the mixer 104. DAC (Digital Analog Converter), or the like, may be used as an abbreviation for the digital-analog convertor 103.

The mixer 104 converts the frequency of the analog signal input from the digital-analog converter 103 on the basis of the frequency of the signal input from the local oscillator 105 and outputs the converted analog signal to the power amplifier 106. MIX (Mixer), or the like, may be used as an abbreviation for the mixer 104. The local oscillator 105 is, for example, a Phase Locked Loop (PLL) circuit that detects the phase difference between an input signal and an output signal, controls a Voltage Controlled Oscillator (VCO) so as to generate a signal with a constant frequency, and inputs the generated signal to the mixer 104.

Figure 4:
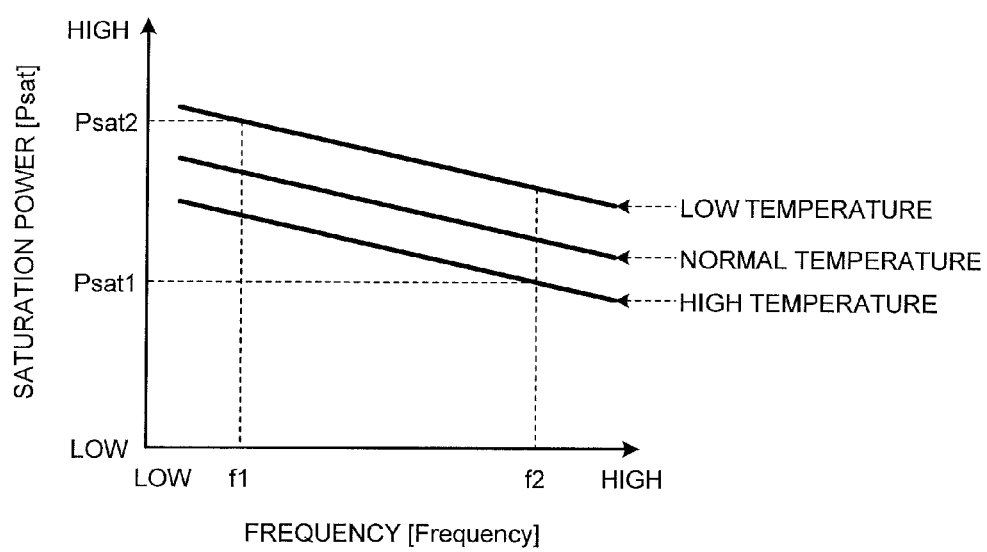
FIG. 4 is a graph that illustrates the characteristics of a power amplifier according to the second embodiment.

The power amplifier 106 amplifies the power of the analog signal input from the mixer 104 and outputs the amplified analog signal from the antenna 111 via the coupler 107. AMP (Amplifier), or the like, may be used as an abbreviation for the power amplifier 106. FIG. 4 is a graph that illustrates the characteristics of the power amplifier 106 according to the second embodiment. The vertical axis indicates the saturation power (Psat) of the power amplifier 106, and the horizontal axis indicates the frequency of the analog signal input to the power amplifier 106. As illustrated in FIG. 4, the saturation power of the power amplifier 106 decreases as the temperature increases. Furthermore, the saturation power of the power amplifier 106 decreases as the frequency increases.

If the maximum value of the frequency is, for example, "f2", the lowest saturation power in the power amplifier 106 is "Psat1", which is obtained when the temperature is "high" and the frequency is "f2", as illustrated in FIG. 4. Therefore, in a conventional technology, a fixed PAPR set value is usually determined and set such that the power of the analog signal input from the mixer 104 falls below the saturation power "Psat1". In this case, because of the input/output characteristics of the power amplifier 106, the region obtained by subtracting a back-off value from the saturation power "Psat1" matches the region sectioned by using a PAPR set value.

However, if the temperature is "normal" or "low" or if the frequency is lower than "f2", the saturation power has to be higher than "Psat1". Specifically, in this case, the region obtained by subtracting a back-off value from the saturation power has to be larger than the region sectioned by using a PAPR set value, which is determined and set in a fixed manner. In such a case, although the PAPR can be set to be larger, excessive PAPR suppression is performed. Not only the power amplifier 106 according to the second embodiment but also common power amplifiers have the characteristics illustrated in FIG. 4.

The coupler 107 extracts part of the power of the analog signal input from the power amplifier 106 and outputs the extracted power to the mixer 108 for feedback. The mixer 108 converts the frequency of the analog signal input from the coupler 107 on the basis of the frequency of the signal input from the local oscillator 109 and outputs the converted analog signal to the analog-digital converter 110. MIX (Mixer), or the like, may be used as an abbreviation for the mixer 108. The local oscillator 109 is, for example, a PLL circuit that detects the phase difference between an input signal and an output signal, controls a VCO so as to generate a signal with a constant frequency, and inputs the generated signal to the mixer 108. In the second embodiment, the local oscillator 105 and the local oscillator 109 generate signals that have the same frequency.

The analog-digital converter 110 converts the analog signal input from the mixer 108 into a digital signal and outputs the converted digital signal to the PAPR determining device 150. ADC (Analog Digital Converter), or the like, may be used as an abbreviation for the analog-digital convertor 110. The antenna 111 radiates the analog signal, which has been input from the power amplifier 106 via the coupler 107, into the airspace.

Next, an explanation is given of the PAPR determining device 150. The PAPR determining device 150 detects a change in temperature, which is one of the causes that changes the saturation power of the power amplifier 106, and, if any change in the temperature is detected, dynamically determines a PAPR set value. Specifically, as illustrated in FIG. 3, the PAPR determining device 150 includes a temperature sensor 151, a PAPR calculating unit 152, a PAPR comparing unit 153, and a PAPR determining unit 154.

The temperature sensor 151 detects a change in the temperature of the communication device 100, which is one of the causes that changes the saturation power of the power amplifier 106, and, if any change in the temperature is detected, notifies the PAPR calculating unit 152, the PAPR comparing unit 153, and the PAPR determining unit 154 of that information. For example, the temperature sensor 151 detects the temperature on a regular basis and, if a predetermined temperature, such as 0° C., 5° C., or 10° C., is detected, determines whether the temperature is different from the previously detected temperature. If they are different, the temperature sensor 151 determines that there is a change in the temperature. Furthermore, for example, the temperature sensor 151 determines that there is a change in the temperature if the temperature changes by a value greater than or equal to 5° C. compared to the previously detected temperature. An explanation is given in the second embodiment of a method of detecting a change in the temperature of the communication device 100; however, the embodiment is not limited to this method, and any method for detecting a change in the temperature of the power amplifier 106 may be used. In such a case, it is preferable that the power amplifier 106 includes a temperature sensor.

When being notified by the temperature sensor 151 that a change in the temperature has been detected, the PAPR calculating unit 152 starts a process for calculating a PAPR value. Specifically, the PAPR calculating unit 152 analyzes the digital signal (hereafter, the feedback signal) input from the analog-digital converter 110 so as to determine the peak power and the average power and then calculates a PAPR value from the determined peak power and average power. The PAPR calculating unit 152 then sends the calculated PAPR value (hereafter, PAPR calculated value) to the PAPR comparing unit 153. As described later, the PAPR calculating unit 152 continues the calculation process until it is notified of the termination by the PAPR determining unit 154.

When being notified by the temperature sensor 151 that a change in the temperature has been detected, the PAPR comparing unit 153 analyzes the digital signal output from the PAPR suppression circuit 101 so as to determine the peak power and the average power and then calculates a PAPR value from the determined peak power and average power. Because the calculated PAPR value is obtained by analyzing the digital signal output from the PAPR suppression circuit 101, the calculated PAPR value don't become greater than the PAPR set value that is set in the PAPR suppression circuit 101.

Next, the PAPR comparing unit 153 compares the PAPR value of the digital signal output from the PAPR suppression circuit 101 with the PAPR calculated value sent from the PAPR calculating unit 152 so as to determine whether the PAPR value matches the PAPR calculated value. The PAPR comparing unit 153 then sends the determination result to the PAPR determining unit 154.

If the PAPR value matches the PAPR calculated value, it means that the waveform of the signal amplified by the power amplifier 106 is not distorted. That is, it means that the area (hereafter, saturation area) where the signal waveform is distorted has not been reached. Conversely, if the PAPR value dose not match the PAPR calculated value, it means that the waveform of the signal amplified by the power amplifier 106 is distorted. That is, it means that the saturation area has been reached.

When being notified by the temperature sensor 151 that a change in the temperature has been detected, the PAPR determining unit 154 first sets the initial value of the PAPR set value in the PAPR suppression circuit 101. Here, the PAPR determining unit 154 sets the initial value that is determined such that the initial value is suitable for a case where the saturation power of the power amplifier 106 is the lowest. Moreover, the PAPR determining unit 154 sets the value that is obtained by adding a predetermined value (e.g., 0.1 (dB)) to the initial value. Furthermore, the PAPR determining unit 154 determines a PAPR set value, which is to be set in the PAPR suppression circuit 101, in accordance with the determination result sent from the PAPR comparing unit 153 and then sets the determined PAPR set value in the PAPR suppression circuit 101.

Specifically, if the determination result sent from the PAPR comparing unit 153 indicates that the PAPR value matches the PAPR calculated value, the PAPR determining unit 154 adds a predetermined value (e.g., 0.1 (dB)) to the current PAPR set value. The PAPR determining unit 154 then sets the increased PAPR set value in the PAPR suppression circuit 101. Conversely, if the determination result sent from the PAPR comparing unit 153 indicates that the PAPR value does not match the PAPR calculated value, the PAPR determining unit 154 subtracts a predetermined value (e.g., 0.1 (dB)) from the current PAPR set value. The PAPR determining unit 154 then sets the decreased PAPR set value in the PAPR suppression circuit 101. The width, such as 0.1 (dB), of the addition or the subtraction is only an example and may be set to be a broader or narrower width as appropriate in accordance with the form of an operation.

Until the determination result sent from the PAPR comparing unit 153 indicates that the PAPR value does not match the PAPR calculated value, the PAPR determining unit 154 according to the second embodiment searches for the largest PAPR set value by gradually increasing the current PAPR set value. Therefore, if the predetermined value is added to the PAPR set value, the PAPR determining unit 154 does not notify the PAPR calculating unit 152 and the PAPR comparing unit 153 of the termination so that the calculation process and the comparing process are continued by the PAPR calculating unit 152 and the PAPR comparing unit 153, respectively. Conversely, when the predetermined value is subtracted from the PAPR set value, it indicates that the PAPR determining unit 154 has been able to find the optimum value. The PAPR determining unit 154 notifies the PAPR calculating unit 152 and the PAPR comparing unit 153 of the termination because the calculation process and the comparing process do not need to be continued by the PAPR calculating unit 152 and the PAPR comparing unit 153, respectively.

Figure 5:
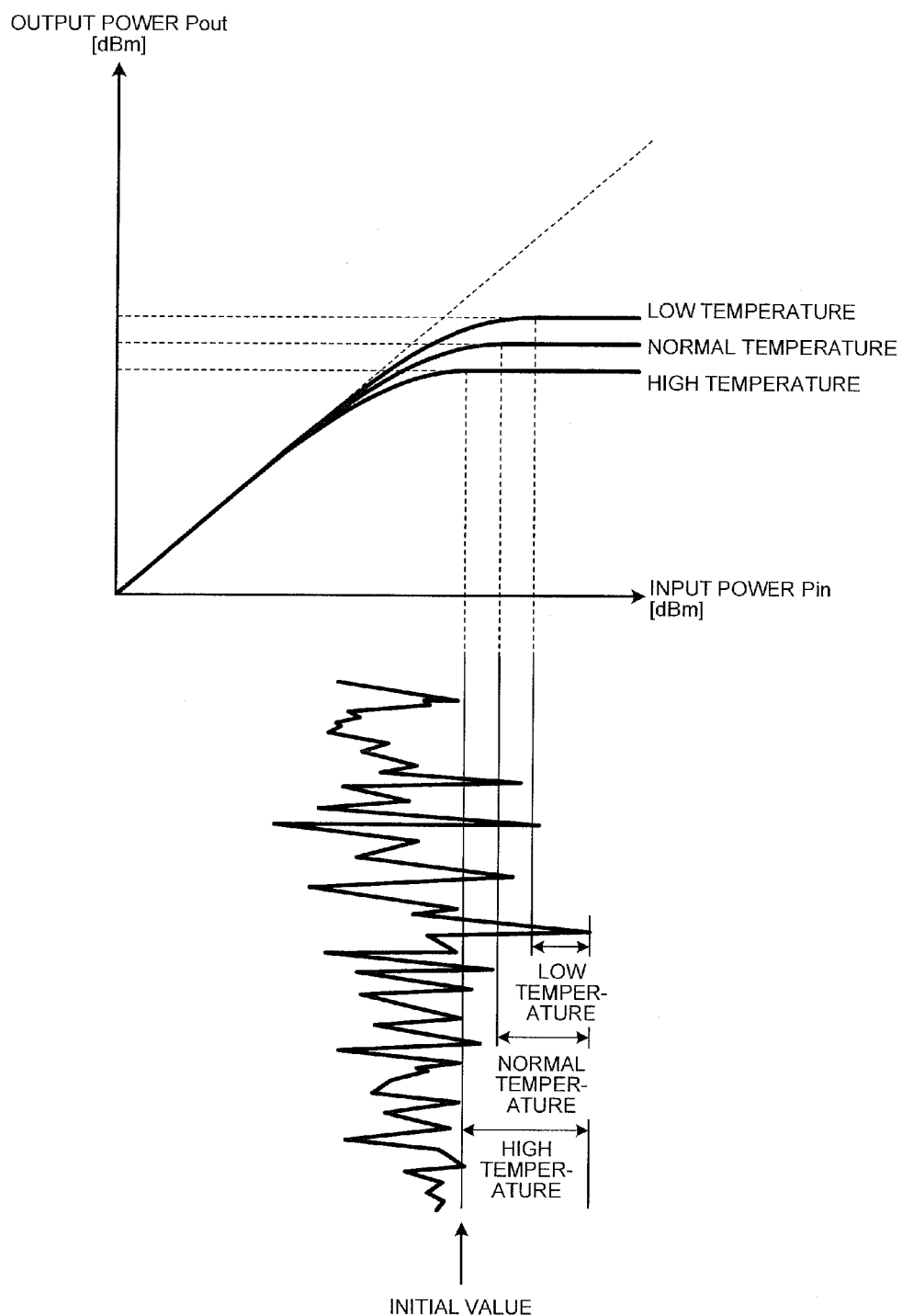
FIG. 5 is a graph that illustrates the relation between a PAPR set value and the saturation power.

Here, an explanation is given, with reference to FIG. 5, of the relation between a dynamically determined PAPR set value and the saturation power. FIG. 5 is a graph that illustrates the relation between a PAPR set value and the saturation power. The graph illustrated in the upper section of FIG. 5 illustrates the relation between the input/output characteristics of the power amplifier 106 and the change in temperature. The vertical axis indicates the output power (Pout (Power Out)) and the horizontal axis indicates the input power (Pin (Power In)). As illustrated in FIG. 5, the power amplifier 106 has input/output characteristics such that the output power is saturated if the input power becomes large, and the saturation power of the power amplifier 106 decreases as the temperature increases.

The EVM is decreased if the signal waveform is distorted; therefore, the initial value of the PAPR set value is set to the lowest value. However, as illustrated in the lower section of FIG. 5, if the temperature is "normal" or "low", the power doesn't exceed the saturation power of the power amplifier 106 without setting the PAPR set value to the lowest value.

Attention is focused on this point, and the communication device 100 according to the second embodiment uses the detection of any change in the temperature of the communication device 100 as a trigger and, in each case, gradually increases the PAPR set value from the initial value so as to search for the optimum value of the PAPR set value. An explanation is given here by using the PAPR set value illustrated in the lower section of FIG. 5. The PAPR set value is searched for, starting from the initial value on the left side and gradually moving up to the PAPR set value on the right side. Because the searched optimum value of the PAPR set value is set in the PAPR suppression circuit 101, it is possible to prevent excessive PAPR suppression and improve the EVM.

Figure 6:
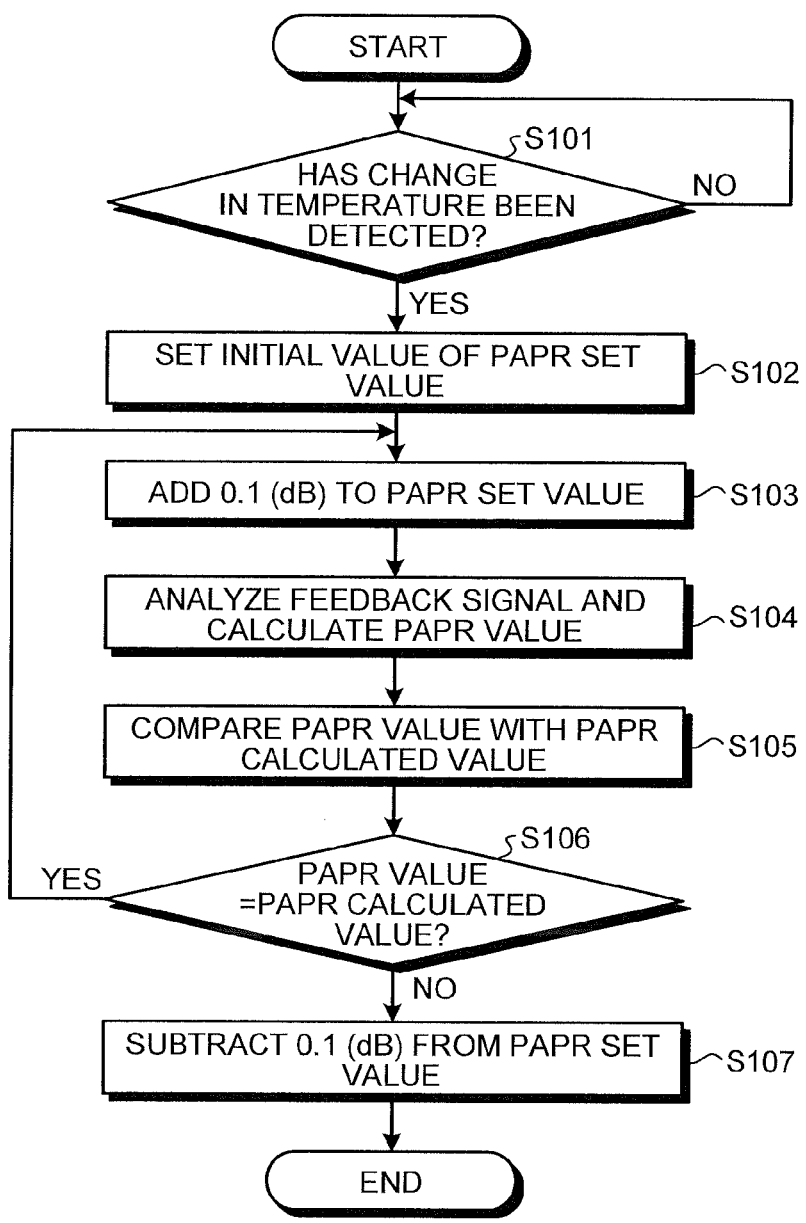
FIG. 6 is a flowchart that illustrates the steps of a process performed by a PAPR determining device according to the second embodiment.

Steps of Process Performed by PAPR Determining Device According to Second Embodiment Next, an explanation is given, with reference to FIG. 6, of the steps of a process performed by the PAPR determining device 150 according to the second embodiment. FIG. 6 is a flowchart that illustrates the steps of a process performed by the PAPR determining device 150 according to the second embodiment.

As illustrated at Step S101 of FIG. 6, the PAPR determining device 150 is triggered to start the process when the temperature sensor 151 detects any change in the temperature of the communication device 100. Specifically, when the temperature sensor 151 detects any change in the temperature of the communication device 100 (Yes at Step S101), the PAPR determining unit 154 sets the initial value of the PAPR set value in the PAPR suppression circuit 101 (Step S102). The initial value of the PAPR set value is determined such that the initial value is suitable for a case where the saturation power of the power amplifier 106 is the lowest. Then, the PAPR determining unit 154 sets the value that is obtained by adding a predetermined value (e.g., 0.1 (dB)) to the initial value of the PAPR set value (Step S103).

Conversely, when being notified by the temperature sensor 151 that a change in the temperature has been detected, the PAPR calculating unit 152 analyzes the feedback signal so as to determine the peak power and the average power and then calculates a PAPR value from the determined peak power and average power (Step S104).

The PAPR comparing unit 153 then compares the PAPR value of the digital signal output from the PAPR suppression circuit 101 with the PAPR calculated value, which has been calculated at Step S104 (Step S105).

If the determination result sent from the PAPR comparing unit 153 indicates that the PAPR value matches the PAPR calculated value (Yes at Step S106), the PAPR determining unit 154 adds, for example, 0.1 (dB) to the current PAPR set value. The PAPR determining unit 154 sets the increased PAPR set value in the PAPR suppression circuit 101 (Step S103).

If the predetermined value is added to the PAPR set value, the PAPR determining unit 154 according to the second embodiment does not notify the PAPR calculating unit 152 and the PAPR comparing unit 153 of the termination so that the calculation process and the comparing process are continued by the PAPR calculating unit 152 and the PAPR comparing unit 153, respectively. Therefore, as illustrated in FIG. 6, the PAPR calculating unit 152 continues to analyze the feedback signal so as to determine the peak power and the average power and then calculates a PAPR value by using the determined peak power and average power (Step S104).

Furthermore, when the PAPR calculated value is sent from the PAPR calculating unit 152, the PAPR comparing unit 153 again compares the PAPR value of the digital value output from the PAPR suppression circuit 101 with the PAPR calculated value (Step S105). That is, the process from Steps S103 to S106 is repeated.

Conversely, if the determination result sent from the PAPR comparing unit 153 indicates that the PAPR value does not match the PAPR calculated value (No at Step S106), the PAPR determining unit 154 subtracts, for example, 0.1 (dB) from the current PAPR set value. The PAPR determining unit 154 then sets the decreased PAPR set value in the PAPR suppression circuit 101 (Step S107).

If the predetermined value has been subtracted from the PAPR set value, it indicates that the PAPR determining unit 154 has been able to find the optimum value. The PAPR determining unit 154 then notifies the PAPR calculating unit 152 and the PAPR comparing unit 153 of the termination, whereby the process is terminated.

Advantages of Second Embodiment

As described above, when any change is detected in the temperature, which is a cause that changes the saturation power of the power amplifier 106, the communication device 100 according to the second embodiment dynamically determines a PAPR set value that corresponds to the changed saturation power. Specifically, the temperature sensor 151 detects a change in the temperature, which is a cause that changes the saturation power of the power amplifier 106. Furthermore, the PAPR calculating unit 152, the PAPR comparing unit 153, and the PAPR determining unit 154 determine a PAPR set value. Specifically, the PAPR calculating unit 152, the PAPR comparing unit 153, and the PAPR determining unit 154 determine a PAPR set value such that the power doesn't exceed the saturation power of the power amplifier 106. Then, the PAPR suppression circuit 101 controls the power of the signal input to the power amplifier 106 so as to obtain the PAPR set value determined by the PAPR determining unit 154.

Thus, the PAPR suppression circuit 101 controls the power of the signal input to the power amplifier 106 so as to obtain the dynamically determined PAPR set value, whereby excessive PAPR suppression performed by the PAPR suppression circuit 101 can be prevented and the EVM can be improved. That is, the EVM can be improved without being reduced within its standard. This leads to an improvement in the line quality and an increase in the transmission speed.

Furthermore, in order to determine a PAPR set value, the communication device 100 sets the initial value that is determined such that the initial value is suitable for a case where the saturation power of the power amplifier 106 is the lowest and searches for the largest PAPR set value by gradually increasing the PAPR set value. Specifically, the communication device 100 uses a method for searching for and dynamically determining an optimum PAPR set value on the basis of the current saturation power of the power amplifier 106 instead of using a method for dynamically determining a PAPR set value on the basis of the value measured before factory shipment.

Thus, the PAPR suppression circuit 101 controls the power of the signal input to the power amplifier 106 so as to obtain the precisely determined PAPR set value, whereby the EVM can be improved more precisely.

[c] Third Embodiment

Next, an explanation is given of a communication device according to a third embodiment. The communication device according to the third embodiment detects a change in the frequency, which is one of the causes that changes the saturation power of a power amplifier, and, when any change in the frequency is detected, dynamically determines a PAPR value of the signal input to the power amplifier.

Configuration of Communication Device According to Third Embodiment

Figure 7:
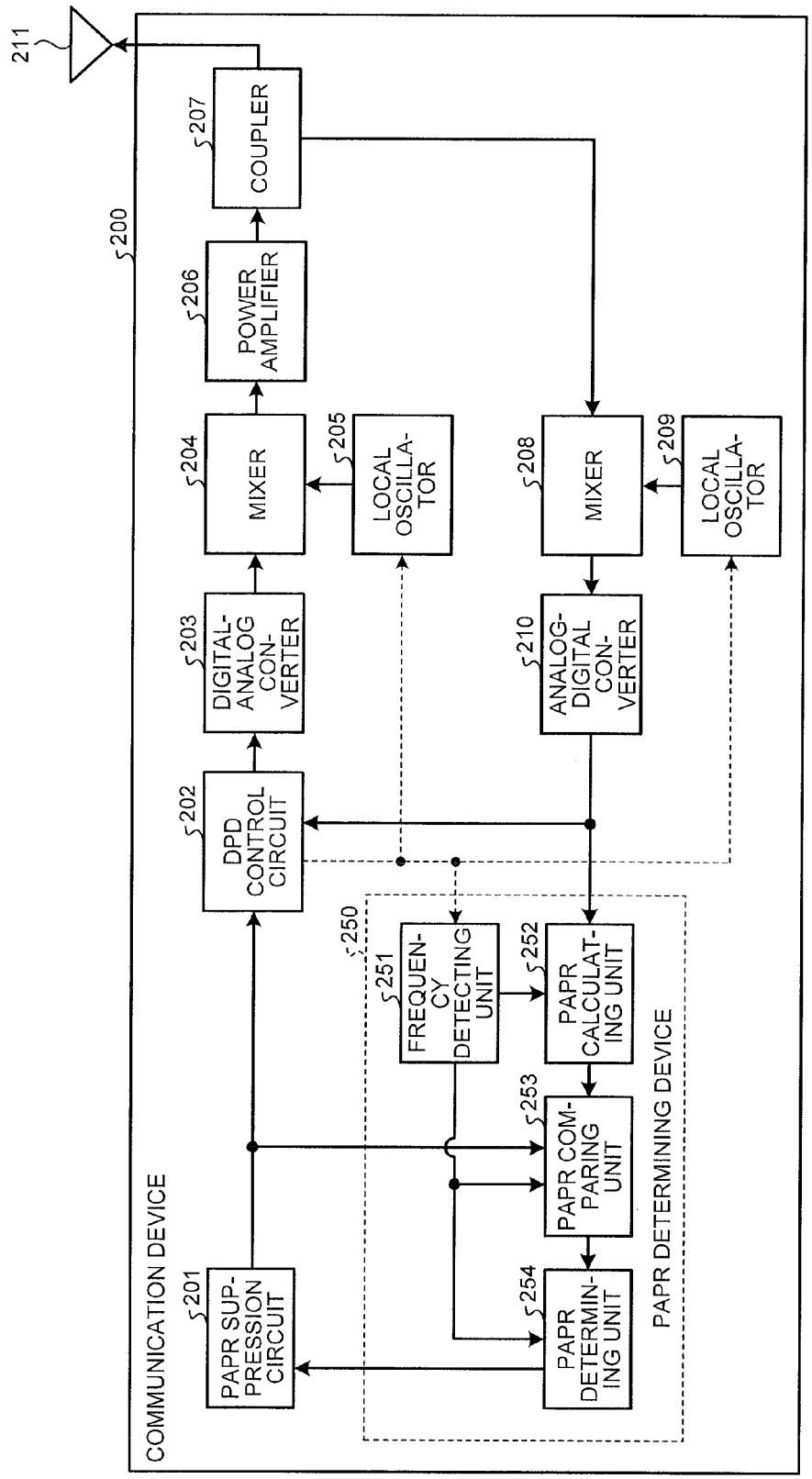
FIG. 7 is a block diagram that illustrates the configuration of a communication device according to a third embodiment.

FIG. 7 is a block diagram that illustrates the configuration of a communication device 200 according to the third embodiment. Here, a PAPR suppression circuit 201, a DPD control circuit 202, and a digital-analog converter 203 according to the third embodiment have the same functions as the PAPR suppression circuit 101, the DPD control circuit 102, and the digital-analog converter 103 according to the second embodiment. Furthermore, a mixer 204, a local oscillator 205, a power amplifier 206, and a coupler 207 according to the third embodiment have the same functions as the mixer 104, the local oscillator 105, the power amplifier 106, and the coupler 107 according to the second embodiment. Moreover, a mixer 208, a local oscillator 209, an analog-digital converter 210, and an antenna 211 according to the third embodiment have the same functions as the mixer 108, the local oscillator 109, the analog-digital converter 110, and the antenna 111 according to the second embodiment. A PAPR determining device 250 according to the third embodiment corresponds to the PAPR determining device 150 according to the second embodiment.

Here, the PAPR determining device 250 according to the third embodiment is different from the PAPR determining device 150 according to the second embodiment in that the PAPR determining device 250 includes a frequency detecting unit 251 instead of the temperature sensor 151. The frequency detecting unit 251 detects a change in the frequency, which is one of the causes that changes the saturation power of the power amplifier 206, and, when any change in the frequency is detected, notifies a PAPR calculating unit 252, a PAPR comparing unit 253, and a PAPR determining unit 254 of the detection. For example, the frequency detecting unit 251 determines that there is a change in the frequency if the frequency changes by a value greater than or equal to 10 MHz compared to the previously detected frequency. For example, if the frequency is changed when the frequency needs to be changed because of its operation, the frequency detecting unit 251 determines that there is a change in the frequency.

Specifically, in the same manner as the second embodiment, the DPD control circuit 202 performs inverse correction on the digital signal, which has been subjected to the PAPR suppression, so as to perform distortion compensation, and outputs the digital signal, which has been subjected to the distortion compensation, to the digital-analog converter 203. Here, the DPD control circuit 202 according to the third embodiment notifies the local oscillator 205 and the local oscillator 209 of a predetermined frequency (control signal) and also notifies the frequency detecting unit 251 of the frequency. As a result, the frequency detecting unit 251 detects a change in the frequency.

The PAPR calculating unit 252 according to the third embodiment corresponds to the PAPR calculating unit 152 according to the second embodiment; however, they are different in that the PAPR calculating unit 252 starts a process for calculating a PAPR value when it is notified by the frequency detecting unit 251 that a change in the frequency has been detected. The PAPR comparing unit 253 according to the third embodiment corresponds to the PAPR comparing unit 153 according to the second embodiment; however, they are different in that the PAPR comparing unit 253 calculates a PAPR value of the digital signal output from the PAPR suppression circuit 201 when it is notified by the frequency detecting unit 251 that a change in the frequency has been detected.

The PAPR determining unit 254 according to the third embodiment corresponds to the PAPR determining unit 154 according to the second embodiment; however, they are different in that the PAPR determining unit 254 sets the initial value of the PAPR set value in the PAPR suppression circuit 201 when it is notified by the frequency detecting unit 251 that a change in the frequency has been detected.

Figure 8:
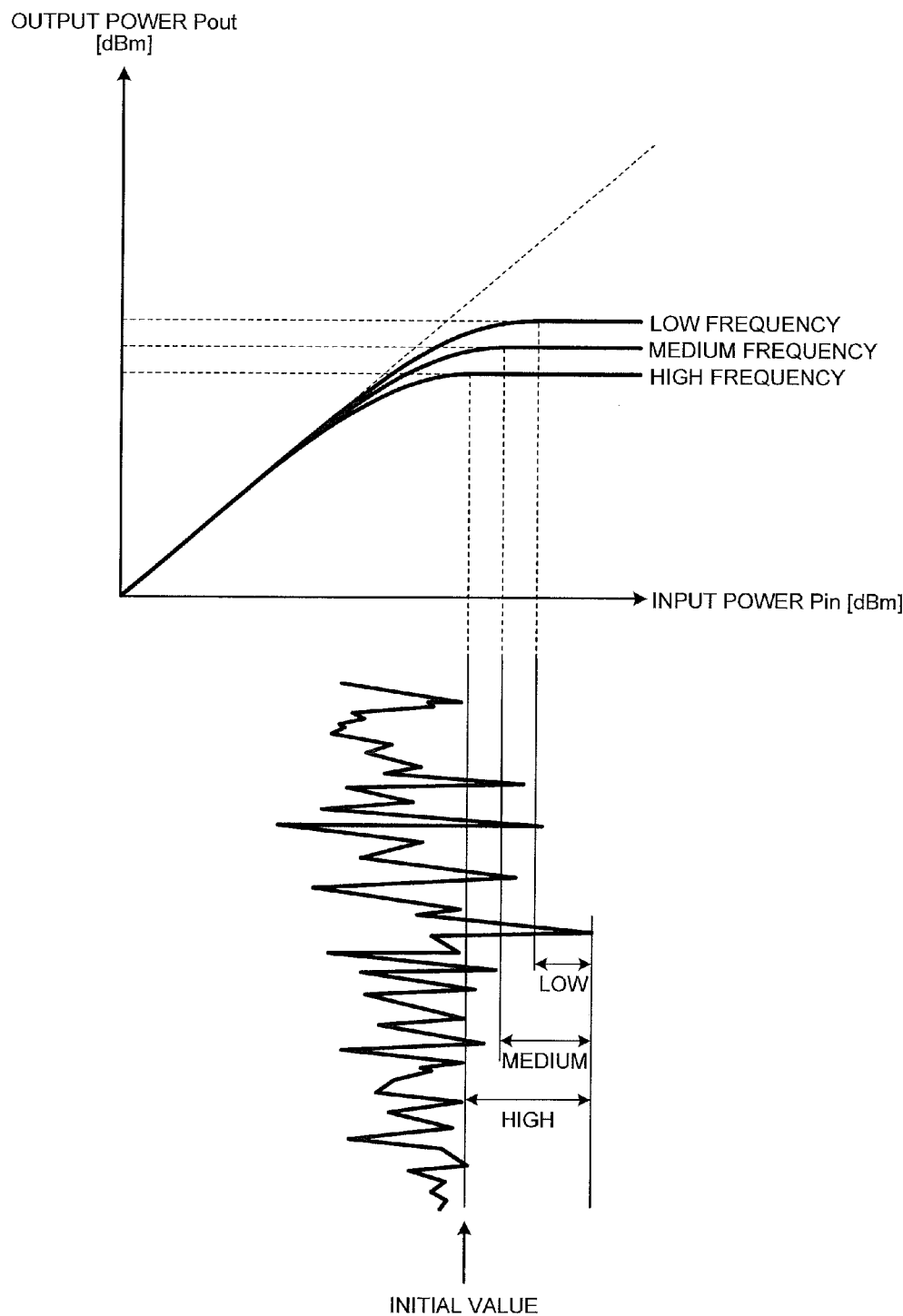
FIG. 8 is a diagram that illustrates the relation between a PAPR set value and the saturation power.

Here, an explanation is given, with reference to FIG. 8, of the relation between the dynamically determined PAPR set value and the saturation power. FIG. 8 is a diagram that illustrates the relation between the PAPR set value and the saturation power. The diagram illustrated in the upper section of FIG. 8 illustrates the relation between the input/output characteristics of the power amplifier 206 and a change in the frequency. The vertical axis indicates the output power (Pout (Power Out)) and the horizontal axis indicates the input power (Pin (Power In)). As illustrated in FIG. 8, although the power amplifier 206 has input/output characteristics such that the output power is saturated if the input power becomes large, the saturation power of the power amplifier 206 is decreased as the frequency is increased.

The EVM is decreased if the signal waveform is distorted; therefore, the initial value of the PAPR set value is set to the lowest value. However, as illustrated in the lower section of FIG. 8, if the frequency is "medium" or "low", the power doesn't exceed the saturation power of the power amplifier 206 without setting the PAPR set value to the lowest value.

Attention is focused on this point, and the communication device 200 according to the third embodiment uses the detection of a change in the frequency as a trigger and, in each case, gradually increases the PAPR set value from the initial value so as to search for the optimum value of the PAPR set value. An explanation is here given by using the PAPR set value illustrated in the lower section of FIG. 8. The PAPR set value is searched for, starting from the initial value on the left side and gradually moving up to the PAPR set value on the right side. Because the searched optimum value of the PAPR set value is set in the PAPR suppression circuit 201, it is possible to prevent excessive PAPR suppression and improve the EVM.

Figure 9:
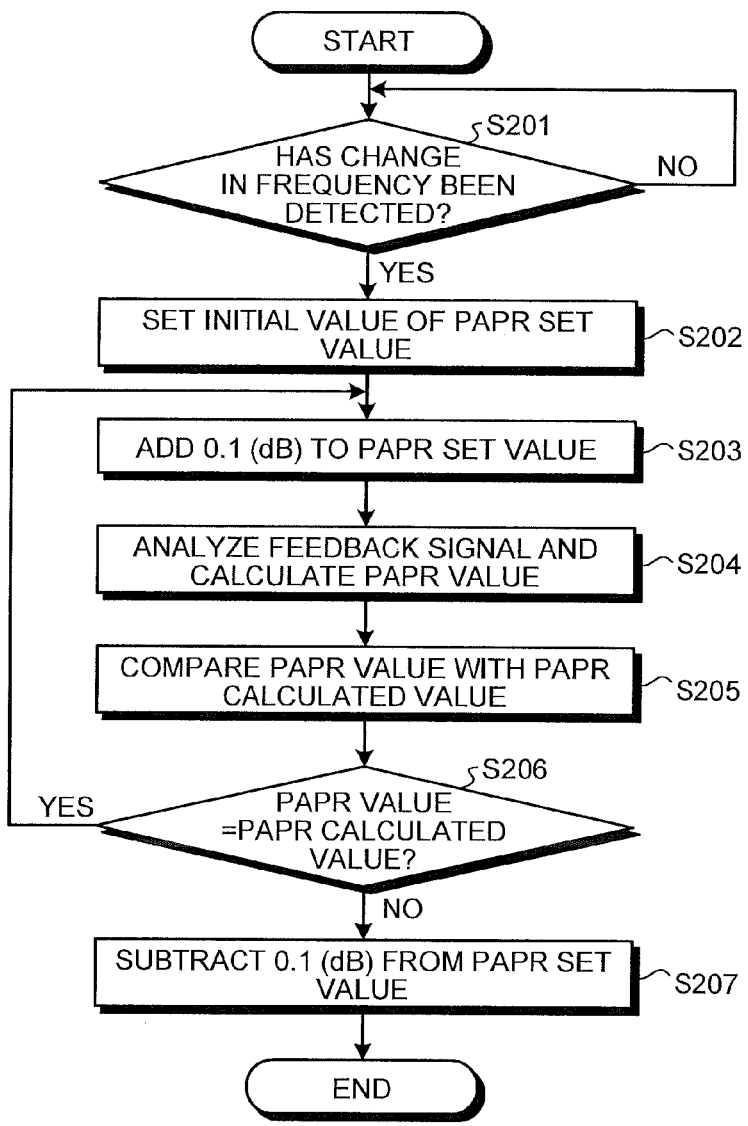
FIG. 9 is a flowchart that illustrates the steps of a process performed by a PAPR determining device according to the third embodiment.

Steps of Process Performed by PAPR Determining Device According to Third Embodiment Next, an explanation is given, with reference to FIG. 9, of the steps of a process performed by the PAPR determining device 250 according to the third embodiment. FIG. 9 is a flowchart that illustrates the steps of a process performed by the PAPR determining device 250 according to the third embodiment. Because Steps S202 to S207 correspond to Steps S102 to S107 of the process performed by the PAPR determining device 150 according to the second embodiment, a brief explanation is given below.

As illustrated at Step S201 of FIG. 9, the PAPR determining device 250 is triggered to start the process when the frequency detecting unit 251 detects any change in the frequency. Specifically, when the frequency detecting unit 251 detects any change in the frequency (Yes at Step S201), the PAPR determining unit 254 sets the initial value of the PAPR set value in the PAPR suppression circuit 201 (Step S202).

Afterward, in the same manner as the PAPR determining device 150 according to the second embodiment, the PAPR determining unit 254 sets the value that is obtained by adding a predetermined value (e.g., 0.1 (dB)) to the initial value of the PAPR set value (Step S203). Moreover, the PAPR calculating unit 252 analyzes the feedback signal so as to determine the peak power and the average power and then calculates a PAPR value from the determined peak power and average power (Step S204).

The PAPR comparing unit 253 then compares the PAPR value of the digital signal output from the PAPR suppression circuit 201 with the PAPR calculated value (Step S205). If the determination result sent from the PAPR comparing unit 253 indicates that the PAPR value matches the PAPR calculated value (Yes at Step S206), the PAPR determining unit 254 adds, for example, 0.1 (dB) to the current PAPR set value. The PAPR determining unit 254 sets the increased PAPR set value in the PAPR suppression circuit 201 (Step S203).

Conversely, if the determination result sent from the PAPR comparing unit 253 indicates that the PAPR value does not match the PAPR calculated value (No at Step S206), the PAPR determining unit 254 subtracts, for example, 0.1 (dB) from the current PAPR set value. The PAPR determining unit 254 then sets the decreased PAPR set value in the PAPR suppression circuit 201 (Step S207).

Advantages of Third Embodiment

As described above, when a change in the frequency is detected, which is a cause that changes the saturation power of the power amplifier 206, the communication device 200 according to the third embodiment dynamically determines a PAPR set value that corresponds to the changed saturation power. Specifically, the frequency detecting unit 251 detects a change in the frequency, which is a cause that changes the saturation power of the power amplifier 206. Furthermore, the PAPR calculating unit 252, the PAPR comparing unit 253, and the PAPR determining unit 254 determine a PAPR set value. Specifically, the PAPR calculating unit 252, the PAPR comparing unit 253, and the PAPR determining unit 254 determine a PAPR set value such that the power doesn't exceed the saturation power of the power amplifier 206. Then, the PAPR suppression circuit 201 controls the power of the signal input to the power amplifier 206 so as to obtain the PAPR set value determined by the PAPR determining unit 254.

Thus, the PAPR suppression circuit 201 controls the power of the signal input to the power amplifier 206 so as to obtain the dynamically determined PAPR set value, whereby excessive PAPR suppression performed by the PAPR suppression circuit 201 can be prevented and the EVM can be improved.

Furthermore, in order to determine a PAPR set value, the communication device 200 sets the initial value that is determined such that the initial value is suitable for a case where the saturation power of the power amplifier 206 is the lowest and searches for the largest PAPR set value by gradually increasing the PAPR set value. Specifically, the communication device 200 uses a method for searching for and dynamically determining an optimum PAPR set value on the basis of the current saturation power of the power amplifier 206 instead of using a method for dynamically determining a PAPR set value on the basis of the value measured before factory shipment.

Thus, the PAPR suppression circuit 201 controls the power of the signal input to the power amplifier 206 so as to obtain the precisely determined PAPR set value, whereby the EVM can be improved more precisely.

[d] Forth Embodiment

Next, an explanation is given of a communication device according to a fourth embodiment. The communication device according to the fourth embodiment detects both a change in the temperature and a change in the frequency, each being one of the causes that changes the saturation power of a power amplifier, and, when any change in the temperature or in the frequency is detected, dynamically determines a PAPR value of the signal input to the power amplifier.

Configuration of Communication Device According to Fourth Embodiment

Figure 10:
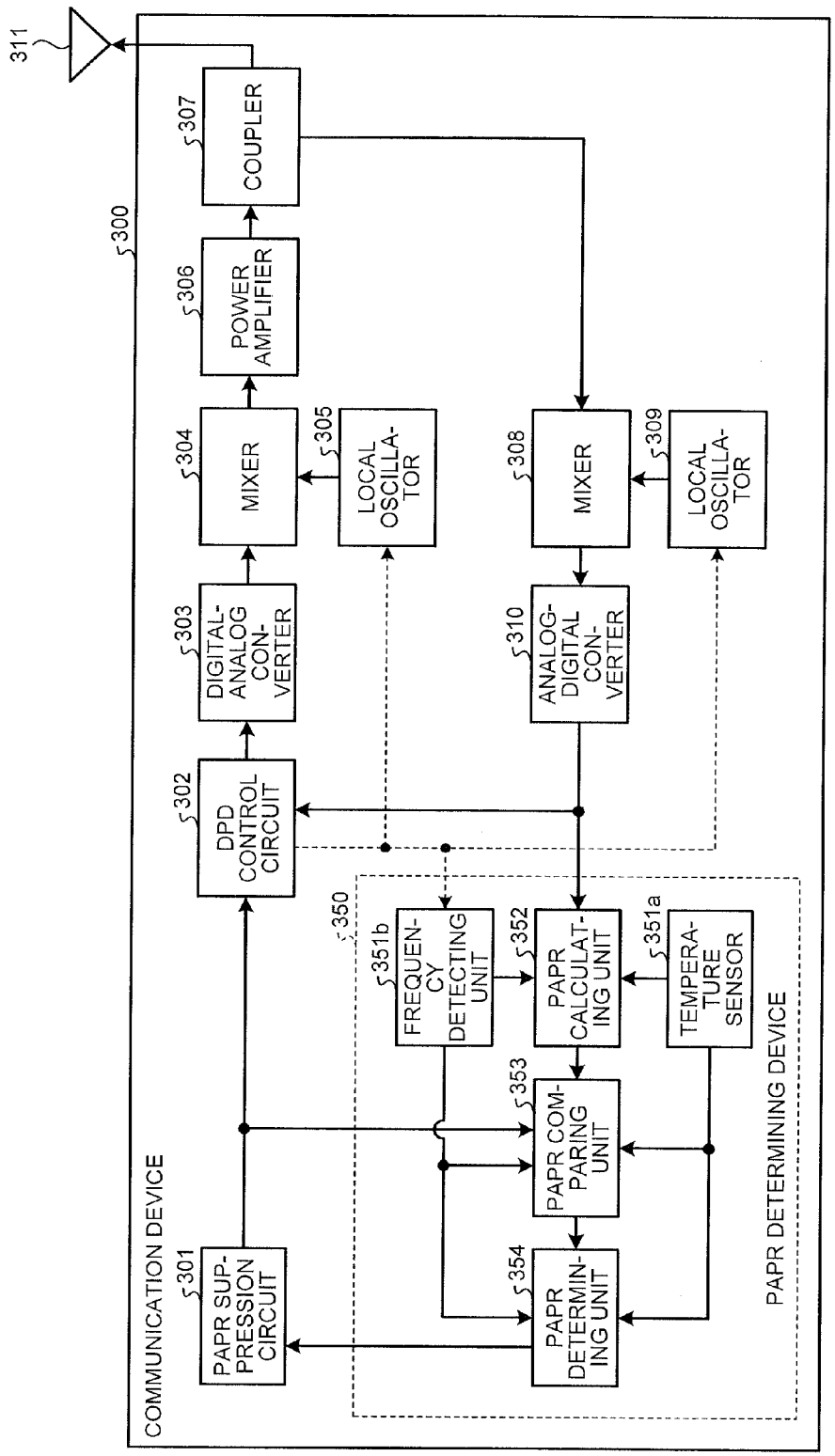
FIG. 10 is a block diagram that illustrates the configuration of a communication device according to a fourth embodiment.

FIG. 10 is a block diagram that illustrates the configuration of a communication device 300 according to the fourth embodiment. Here, a PAPR suppression circuit 301, a DPD control circuit 302, and a digital-analog converter 303 according to the fourth embodiment have the same functions as the PAPR suppression circuit 101, the DPD control circuit 102, and the digital-analog converter 103 according to the second embodiment. Furthermore, a mixer 304, a local oscillator 305, a power amplifier 306, and a coupler 307 according to the fourth embodiment have the same functions as the mixer 104, the local oscillator 105, the power amplifier 106, and the coupler 107 according to the second embodiment. Moreover, a mixer 308, a local oscillator 309, an analog-digital converter 310, and an antenna 311 according to the fourth embodiment have the same functions as the mixer 108, the local oscillator 109, the analog-digital converter 110, and the antenna 111 according to the second embodiment. A PAPR determining device 350 according to the fourth embodiment corresponds to the PAPR determining device 150 according to the second embodiment.

Here, the PAPR determining device 350 according to the fourth embodiment is different from the PAPR determining device 150 according to the second embodiment in that the PAPR determining device 350 includes not only a temperature sensor 351a but also a frequency detecting unit 351b. The frequency detecting unit 351b detects a change in the frequency, which is one of the causes that changes the saturation power of the power amplifier 306, and, when any change in the frequency is detected, notifies a PAPR calculating unit 352, a PAPR comparing unit 353, and a PAPR determining unit 354 of the detection.

Specifically, in the same manner as the second embodiment, the DPD control circuit 302 performs inverse correction on the digital signal, which has been subjected to the PAPR suppression, so as to perform distortion compensation, and outputs the digital signal, which has been subjected to the distortion compensation, to the digital-analog converter 303. Here, the DPD control circuit 302 according to the fourth embodiment notifies the local oscillator 305 and the local oscillator 309 of a predetermined frequency and also notifies the frequency detecting unit 351b of the frequency. As a result, the frequency detecting unit 351b detects a change in the frequency.

The PAPR calculating unit 352 according to the fourth embodiment corresponds to the PAPR calculating unit 152 according to the second embodiment. The PAPR calculating unit 352 starts a process for calculating a PAPR value when it is notified by the frequency detecting unit 351b that a change in the frequency has been detected as well as when it is notified by the temperature sensor 351a that a change in the temperature has been detected. The PAPR comparing unit 353 according to the fourth embodiment corresponds to the PAPR comparing unit 153 according to the second embodiment. The PAPR comparing unit 353 also calculates a PAPR value of the digital signal output from the PAPR suppression circuit 301 when it is notified by the frequency detecting unit 351b that a change in the frequency has been detected.

The PAPR determining unit 354 according to the fourth embodiment corresponds to the PAPR determining unit 154 according to the second embodiment. The PAPR determining unit 354 also sets the initial value of the PAPR set value in the PAPR suppression circuit 301 when it is notified by the frequency detecting unit 351b that a change in the frequency has been detected.

Figure 11:
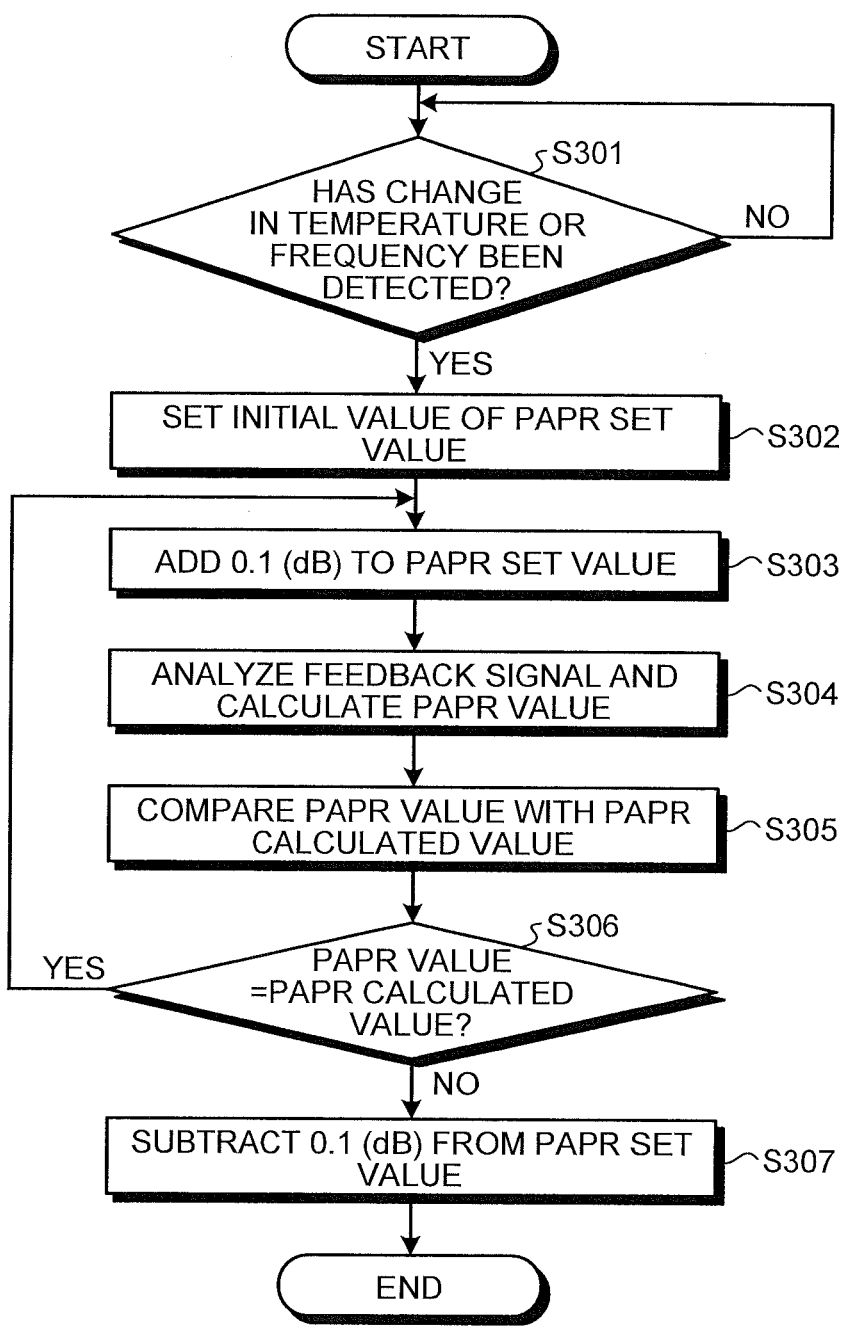
FIG. 11 is a flowchart that illustrates the steps of a process performed by a PAPR determining device according to the fourth embodiment.

Steps of Process Performed by PAPR Determining Device According to Fourth Embodiment Next, an explanation is given, with reference to FIG. 11, of the steps of a process performed by the PAPR determining device 350 according to a fourth embodiment. FIG. 11 is a flowchart that illustrates the steps of a process performed by the PAPR determining device 350 according to the fourth embodiment. Because Steps S302 to S307 correspond to Steps S102 to S107 of the process performed by the PAPR determining device 150 according to the second embodiment, a brief explanation is given below.

As illustrated at Step S301 of FIG. 11, the PAPR determining device 350 is triggered to start the process when the temperature sensor 351a detects any change in the temperature or when the frequency detecting unit 351b detects any change in the frequency. Specifically, when the temperature sensor 351a detects any change in the temperature or when the frequency detecting unit 351b detects any change in the frequency (Yes at Step S301), the PAPR determining unit 354 sets the initial value of the PAPR set value in the PAPR suppression circuit 301 (Step S302).

Afterward, in the same manner as the PAPR determining device 150 according to the second embodiment, the PAPR determining unit 354 sets the value that is obtained by adding a predetermined value (e.g., 0.1 (dB)) to the initial value of the PAPR set value (Step S303). Furthermore, the PAPR calculating unit 352 analyzes the feedback signal so as to determine the peak power and the average power and then calculates a PAPR value from the determined peak power and average power (Step S304).

The PAPR comparing unit 353 then compares the PAPR value of the digital signal output from the PAPR suppression circuit 301 with the PAPR calculated value (Step S305). If the determination result sent from the PAPR comparing unit 353 indicates that the PAPR value matches the PAPR calculated value (Yes at Step S306), the PAPR determining unit 354 adds, for example, 0.1 (dB) to the current PAPR set value. The PAPR determining unit 354 then sets the increased PAPR set value in the PAPR suppression circuit 301 (Step S303).

Conversely, if the determination result sent from the PAPR comparing unit 353 indicates that the PAPR value does not match the PAPR calculated value (No at Step S306), the PAPR determining unit 354 subtracts, for example, 0.1 (dB) from the current PAPR set value. The PAPR determining unit 354 then sets the decreased PAPR set value in the PAPR suppression circuit 301 (Step S307).

Advantages of Fourth Embodiment

As described above, when any change is detected in the temperature or the frequency, which is a cause that changes the saturation power of the power amplifier 306, the communication device 300 according to the fourth embodiment dynamically determines a PAPR set value that corresponds to the changed saturation power. Specifically, the temperature sensor 351a detects a change in the temperature, which is a cause that changes the saturation power of the power amplifier 306. Furthermore, the frequency detecting unit 351b detects a change in the frequency, which is a cause that changes the saturation power of the power amplifier 306. Furthermore, the PAPR calculating unit 352, the PAPR comparing unit 353, and the PAPR determining unit 354 determine a PAPR set value of the signal input to the power amplifier 306. Specifically, the PAPR calculating unit 352, the PAPR comparing unit 353, and the PAPR determining unit 354 determine a PAPR set value such that the power doesn't exceed the saturation power of the power amplifier 306. Then, the PAPR suppression circuit 301 controls the power of the signal input to the power amplifier 306 so as to obtain the PAPR set value determined by the PAPR determining unit 354.

Thus, the PAPR suppression circuit 301 controls the power of the signal input to the power amplifier 306 so as to obtain the dynamically determined PAPR set value, whereby excessive PAPR suppression performed by the PAPR suppression circuit 301 can be prevented and the EVM can be improved.

Furthermore, in order to determine a PAPR set value, the communication device 300 sets the initial value that is determined such that the initial value is suitable for a case where the saturation power of the power amplifier 306 is the lowest and searches for the largest PAPR set value by gradually increasing the PAPR set value. Specifically, the communication device 300 uses a method for searching for and dynamically determining an optimum PAPR set value on the basis of the current saturation power of the power amplifier 306 instead of using a method for dynamically determining a PAPR set value on the basis of the value measured before the factory shipment.

Thus, the PAPR suppression circuit 301 controls the power of the signal input to the power amplifier 306 so as to obtain the precisely determined PAPR set value, whereby the EVM can be improved more precisely.

[e] Fifth Embodiment

The first to fourth embodiments are explained above; however, they are only examples, and various changes and modifications may be made to the PAPR determining device and the communication device disclosed in the present application so that the PAPR determining device and the communication device may be embodied in a different form.

Causes that Change Saturation Power

In the above-described second to fourth embodiments, an explanation is given of a method for detecting a change in "temperature" or "frequency" or "both temperature and frequency", which are the causes that change the saturation power. However, the disclosed technology is not limited to these. If there is a different cause that changes the saturation power, any change in the different cause may be detected and a PAPR set value may be dynamically determined. For example, if deterioration of a power amplifier can be a cause that changes the saturation power, any change in the "age of usage" may be detected and a PAPR set value may be dynamically determined.

Determination of PAPR Set Value

In the above-described second to fourth embodiments, an explanation is given of a method for determining a PAPR set value by setting the initial value and gradually increasing the PAPR set value so as to search for the largest PAPR set value such that the power doesn't exceed the saturation power. However, the disclosed technology is not limited to these. For example, before factory shipment, the correspondence relationships between a "temperature" and an "optimum value of a PAPR set value" and between a "frequency" and an "optimum value of a PAPR set value" are measured in advance, and the PAPR determining device pre-stores therein tables of these correspondence relationships. In this case, if, for example, a temperature sensor detects any change in the temperature, the PAPR determining device searches the table of the correspondence relationship by using the detected "temperature" and acquires the "optimum value of a PAPR set value" that is stored and related to the detected "temperature". The PAPR determining device then sets the acquired "optimum value" in the PAPR suppression circuit.

OFDM, OFDMA

As described above, the PAPR determining device and the communication device disclosed in the present application can be also used if OFDMA is used as a transmission system. Furthermore, even if a different transmission system is used, the PAPR determining device and the communication device can be also used as long as a power amplifier amplifies signals in the transmission system.

Communication Device

The PAPR determining device disclosed in the present application is installed in a communication device, such as a base station or mobile terminal, that includes at least a power amplifier.

Computer

Figure 12:
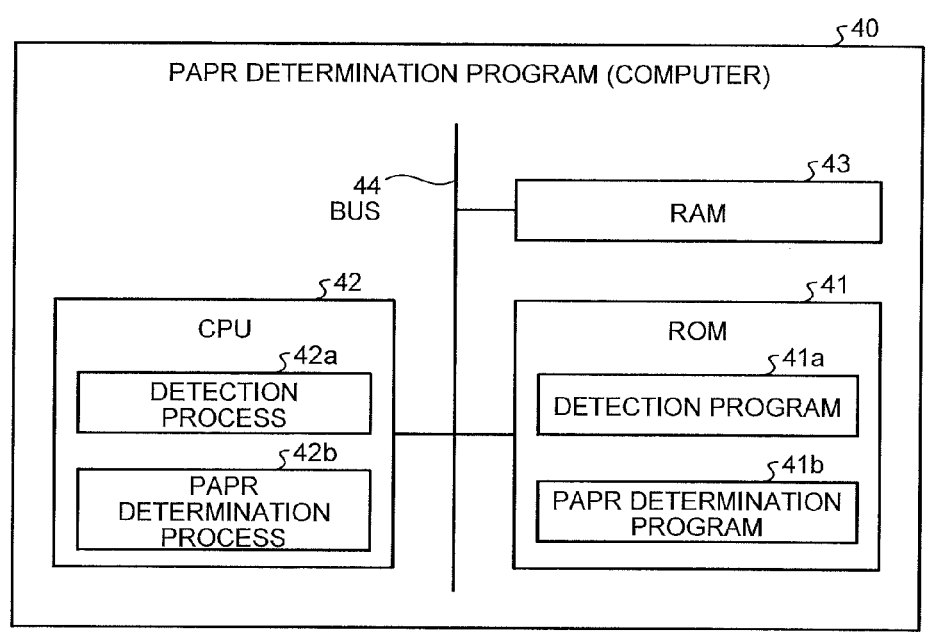
FIG. 12 is a diagram that illustrates a computer that executes a PAPR determination program.
Figure 13:
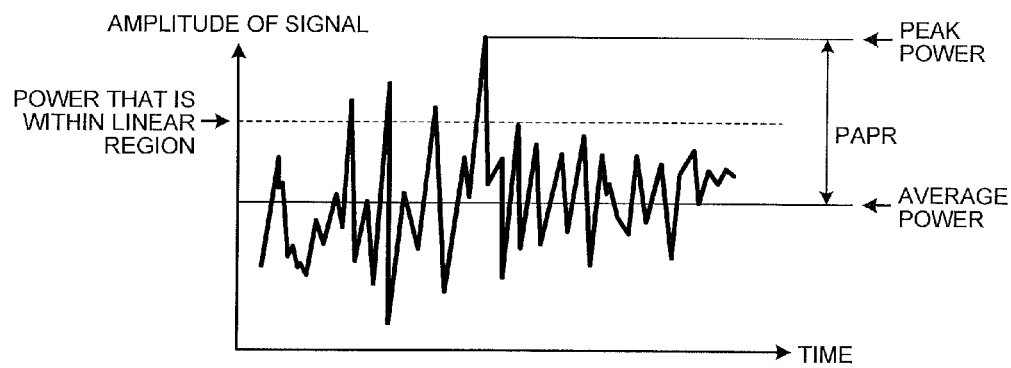
FIG. 13 is a graph that illustrates an OFDM signal waveform, which is plotted along the time axis.
Figure 14:
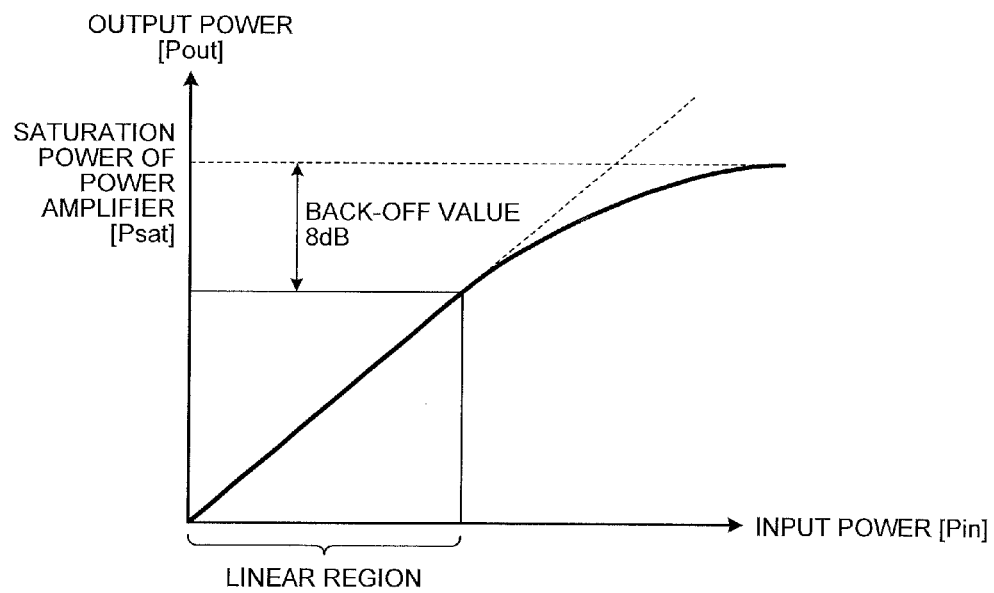
FIG. 14 is a graph that illustrates the input/output characteristics of a power amplifier.

The PAPR determining process described in the above-described first to fourth embodiments can be performed by using a prepared PAPR determination program that is executed by a computer included in a communication device, such as a base station or mobile terminal. FIG. 12 is a diagram that illustrates a computer that executes a PAPR determination program.

As illustrated in FIG. 12, a computer 40, which executes a PAPR determination program, principally includes a Read Only Memory (ROM) 41, a Central Processing Unit (CPU) 42, and a Random Access Memory (RAM) 43. The ROM 41, the CPU 42, and the RAM 43 are connected to one another via a bus 44.

The ROM 41 stores a PAPR determination program that performs the same functions as those in the first to fourth embodiments, i.e., a detection program 41a and a PAPR determination program 41b, as illustrated in FIG. 12. The detection program 41a detects predetermined value's changes, which are a cause of changes in the saturation power of a power amplifier. When the detection program 41a detects any change in the predetermined value, the PAPR determination program 41b determines a PAPR value of the signal input to the power amplifier such that the power doesn't exceed the saturation power of the power amplifier. The programs 41a and 41b do not always need to be stored in the ROM 41.

The CPU 42 reads the programs 41a and 41b from the ROM 41 and executes them. Then, the programs 41a and 41b become a detection process 42a and a PAPR determination process 42b, as illustrated in FIG. 12. The processes 42a and 42b correspond to, for example, the detecting unit 11 and the PAPR determining unit 12, respectively, illustrated in FIG. 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A PAPR determining device comprising:
a detecting unit that detects a change of a parameter that is related to a power amplifying unit, the change of the parameter causing a change of a saturation power of the power amplifying unit; and
a determining unit that, when the detecting unit detects the change of the parameter, determines a Peak-to-Average Power Ratio (PAPR) value that is used for controlling an input power of the power amplifying unit and is largest among PAPR values, each of which equaling a feedback PAPR value of an output power of the power amplifying unit.

2. The PAPR determining device according to claim 1, wherein, when the detecting unit detects the change of the parameter, the determining unit sets, as an initial value, a PAPR value that is determined such that the set PAPR value is suitable for a case where the saturation power of the power amplifying unit is lowest, and gradually increases the set PAPR value to search for and determine the PAPR value that is largest.

3. A communication device comprising:
a power amplifying unit that amplifies a power of an input signal and outputs an amplified signal;
a detecting unit that detects a change of a parameter, which is related to the power amplifying unit, the change of the parameter causing a change of a saturation power of the power amplifying unit;
a determining unit that, when the detecting unit detects the change of the parameter, determines a PAPR value that is used for controlling the power of the input signal of the power amplifying unit and is largest among PAPR values, each of which equaling a feedback PAPR value of the amplified signal of the power amplifying unit; and a control unit that controls the power of the signal input to the power amplifying unit so as to obtain the PAPR value determined by the determining unit.

4. A PAPR determining device comprising:

a memory; and a processor coupled to the memory, wherein the processor executes a process comprising:

detecting a change of a parameter that is related to a power amplifying unit, the change of the parameter causing a change of a saturation power of the power amplifying unit; and determining, when the detecting detects the change of the parameter, a PAPR value that is used for controlling an input power of the power amplifying unit and is largest among PAPR values, each of which equaling a feedback PAPR value of an output power of the power amplifying unit.

* * * * *